United States Patent [19]

Matsuta

[11] Patent Number: 4,649,461
[45] Date of Patent: Mar. 10, 1987

[54] GROUNDING CONSTRUCTION FOR MULTILAYER PRINTED CIRCUIT BOARDS

[75] Inventor: Shigetoshi Matsuta, Soma, Japan

[73] Assignee: Alps Electric Co., Ltd., Japan

[21] Appl. No.: 689,389

[22] Filed: Jan. 7, 1985

[30] Foreign Application Priority Data

Dec. 28, 1983 [JP] Japan ............... 58-199136[U]

[51] Int. Cl.⁴ .................................. H05K 1/14
[52] U.S. Cl. .................. 361/415; 174/35 R; 174/51; 361/414
[58] Field of Search ............ 361/415, 414, 412, 419; 174/68.5, 51, 35 R

[56] References Cited

U.S. PATENT DOCUMENTS

| | | | |
|---|---|---|---|
| 2,757,319 | 7/1956 | Kapp | 174/68.5 X |
| 2,869,040 | 1/1959 | Pifer | 361/414 X |
| 2,923,860 | 2/1960 | Miller | 174/68.5 |
| 3,151,278 | 9/1964 | Elarde et al. | 174/68.5 X |
| 3,272,909 | 9/1966 | Bruck et al. | 361/412 X |
| 3,296,099 | 1/1967 | Dinella | 174/68.5 X |
| 3,443,160 | 5/1969 | Salera | 174/68.5 X |
| 3,594,493 | 7/1971 | Kauffman et al. | 174/68.5 |
| 3,628,105 | 12/1971 | Sakai | 174/52 FP |
| 3,719,860 | 3/1973 | Lawrence | 361/418 X |
| 3,806,767 | 4/1974 | Lehrfeld | 361/412 |
| 3,977,074 | 8/1976 | Furnival | 174/68.5 X |
| 4,498,119 | 2/1985 | Cronin | 361/415 X |

OTHER PUBLICATIONS

E. W. Hardin, Laminated Packet for Tunnel Diodes, IBM Tech. Disc. Bull., V. #4, #5, Oct. 1951, p. 46 relid on.

Primary Examiner—B. R. Kucia
Attorney, Agent, or Firm—Guy W. Shoup

[57] ABSTRACT

An grounding construction of a multilayer printed circuit board includes a metal plate connected to a chassis and provided with at least one upright tab, and two sheets of printed circuit boards for sandwiching the metal plate therebetween. One of the printed circuit boards is formed therein a through hole for passing the upright tab therethrough so as to protrude it from the outer surface thereof. The upright tab is fixedly connected by a solder to a conduction pattern formed around the through hole on the outer surface of the one of the printed circuit boards.

3 Claims, 6 Drawing Figures

GROUNDING CONSTRUCTION FOR MULTILAYER PRINTED CIRCUIT BOARDS

BACKGROUND OF THE INVENTION

The present invention relates to an grounding construction of a multilayer printed circuit board.

FIG. 1 is a cross-section of a typical example of conventional earthing constructions of multilayer printed circuit boards. In FIG. 1, a reference numeral 1 designates a first printed circuit board, 2 a second printing circuit board, 3 and 4 conduction patterns oppositely provided on the outer surfaces of the first and second printed circuit boards 1 and 2, respectively 5, 6, 7 and 8 through holes provided in the conduction pattern 3, first circuit board 1, second circuit board 2 and the conduction pattern 4 respectively for passing an electric part therethrough. The electric part 9 is inserted in the through holes 5, 6, 7 and 8 so that its both ends protrude from the outer surfaces of the first and second circuit boards 1 and 2 slightly and the protruded both ends are fixedly soldered by solders 10 and 11, respectively. A reference numeral 12 designates an grounding conduction pattern provided on the outer surface of the first printed circuit board 1, 13 an grounding conduction pattern provided on the outer surface of the second printed circuit board 2 in opposition to the grounding conduction pattern 12, 14, 15, 16 and 17 through holes provided in the grounding conduction pattern 12, first printed circuit board 1, second printing circuit board 2 and grounding conduction pattern 13 for passing a pin A therethrough. The pin A is inserted in the through holes 14, 15, 16 and 17 so that both ends thereof protrude from the outer surfaces of the first and second circuit boards 1 and 2 slightly and the protruded both ends are fixedly soldered by solders 18 and 19. One end of the grounding conduction pattern 13 is fixedly connected to a chassis 20 through a solder 20. Namely, in the conventional grounding instructions, the earthing of the first and second printed circuit boards 1 and 2 is performed in a manner that the grounding conduction patterns 12 and 13 oppositely provided on the outer surfaces of the first and second printed circuit boards 1 and are electrically connected by the pin A which is inserted in the through holes formed in the patterns 12 and 13, respectively. Thus, the number of parts required for the grounding construction increases due to the requirement of the pin A. Further, since the grounding conduction patterns 12 and 13 are required to be provided on the outer surfaces of the first and second printed circuit boards 1 and 2 in an opposite relation, a degree of freedom in designing other circuit patterns (not shown) is limited. Further, it is impossible to electrically shield the first printed circuit board 1 from the second printed circuit board 2 due to the provision of the pin A, and the grounding characteristics of the grounding construction is deteriorated due to the provision of the elongated grounding conduction pattern 13 with a narrow width for electrically connecting the pin to the chassis 20.

SUMMARY OF THE INVENTION

An object of the present invention is to obviate the above-described drawbacks of the conventional grounding construction of a multilayer printed circuit board.

Another object of the present invention is to provide an grounding construction of a multilayer printed circuit board which is capable of grounding the printed circuit boards effectively with a small number of parts and capable of shielding one of the printed circuit boards effectively from the other without limiting the degree of freedom in designing other circuit patterns.

DESCRIPTION OF THE PREFERRED EMBODIMENT

Figure 1:
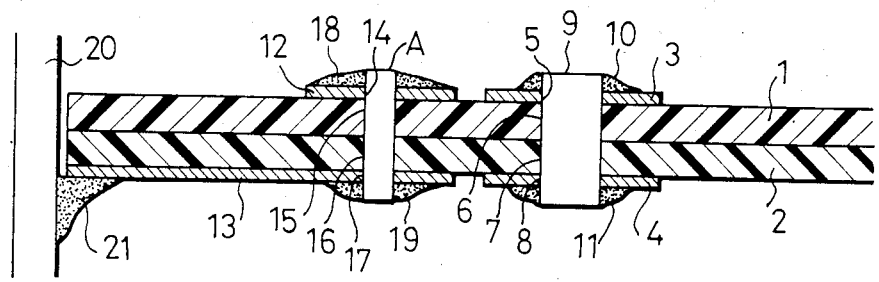
FIG. 1 is a cross section showing an example of conventional grounding construction for a multilayer printed circuit board.
Figure 2:
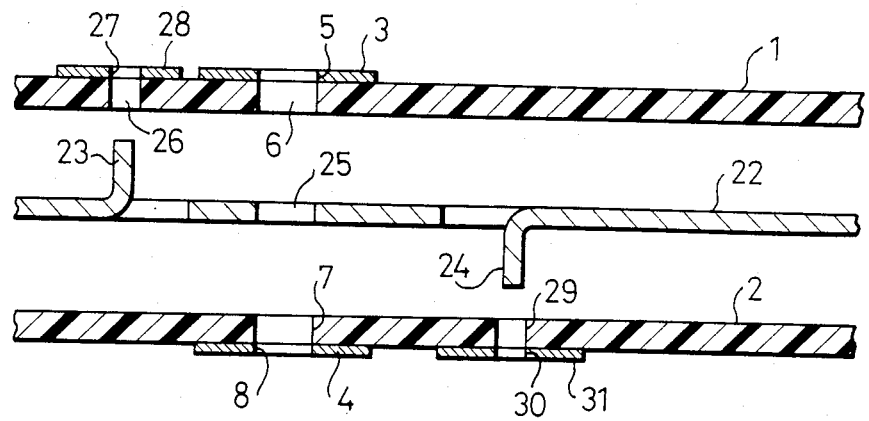
FIG. 2 is a cross sectional deal drawing showing an embodiment of an grounding construction for a multilayer printed circuit board according to the present invention.
Figure 3:
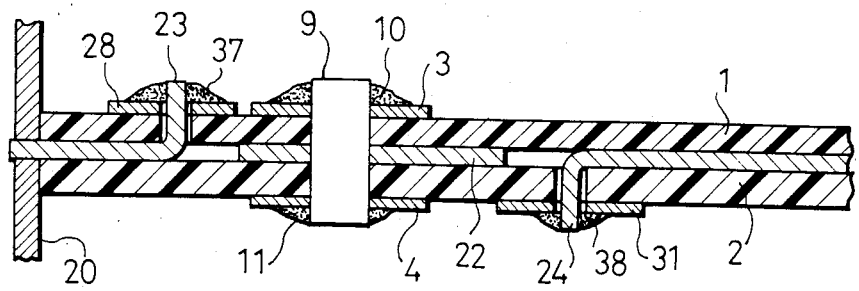
FIG. 3 is a cross section of the earthing construction of FIG. 2 after having been assembled.

FIGS. 2 and 3 show an embodiment of the present invention, wherein FIG. 2 is a cross-sectional deal drawing showing an embodiment of an earthing construction of a multilayer printed circuit board according to the present invention and FIG. 3 shows a cross section of the embodiment of FIG. 2 after having been assembled. In FIGS. 2 and 3, like reference numerals designate like components in FIG. 1.

In FIGS. 2 and 3, a reference numeral 22 designates a metal plate made of iron or other metal to be placed between the first and second printed circuit boards 1 and 2. The metal plate 22 has an upright tabs 23 and a dependent tab 24 and a through hole 25 for passing an electric part 9 therethrough. Reference numerals 26 and 27 designate through holes formed in the first printed circuit board 1 and an grounding conduction pattern 28 provided on an upper surface thereof for passing the upright tab 23 therethrough, respectively, and 29 and 30 through holes formed in the second printed circuit board 2 and an grounding conduction pattern 31 provided on a lower surface thereof for passing the dependent tab 24 therethrough, respectively.

An example of methods of assembling and wiring the first and second printed circuit boards 1 and 2 will be explained.

At first, the upright tab 23 of the metal plate 22 is inserted into the through holes 26 and 27 of the first printed circuit board 1 and the grounding conduction pattern 28 so that its tip portion protrudes from the upper surface of the grounding conduction pattern 28 slightly thereby lying the first printed circuit board 1 on the upper surface of the metal plate 22. The dependent tab 24 of the metal plate 22 is then inserted into the through holes 29 and 30 of the second printed circuit board 2 and the grounding conduction pattern 31 so that its tip portion protrudes from the lower surface of the grounding conduction pattern 31 slightly thereby lying the metal plate 22 on the upper surface of the second printed circuit board 2. The upright tab 28 and the dependent tab 24 are fixedly connected to the associated grounding conduction patterns 28 and 31 through solders 37 and 38, respectively. An electric part 9 is inserted into the through holes 5, 6, 25, 7 and 8 of the conduction pattern 3, the first printed circuit board; the metal plate 22, the second printed circuit board 2 and the conduction pattern 4 respectively thereby standing the part 9 in these through holes so that its both ends protrude from the upper and lower surfaces of the conduction patterns 3 and slightly, respectively. Both ends of the part 9 is fixedly connected to the conduction patterns 3 and 4 through solders 10 and 11. Finally, one end of the metal plate 22 is connected to the chassis 20.

In thus constructed multilayer printed circuit board, the metal plate 22 is inserted between the first and second printed circuit boards 1 and 2, so that it is possible to electrically shield the conduction patterns on the upper surface of the first printed circuit board 1 from the conduction patterns on the lower surface of the second printed circuit board 2. Grounding circuits for the first and second printed circuit boards 1 and 2 can be provides separately because the metal plate 22 is provided with the upright and dependent tabs 23 and 24 acting as grounding circuits. An area of the metal plate 22 can be made larger than an area of the conventional grounding conduction pattern 13 provided on the second printed circuit board 2, so that the earthing effect of this embodiment is superior to that of the conventional grounding construction. Further, the grounding conduction patterns provided on the first and second printed circuit boards 1 and 2 are not required to be disposed in an opposite relation, so that the degree of freedom in designing other circuit patterns can be improved when compared with the conventional grounding construction.

Figure 4:
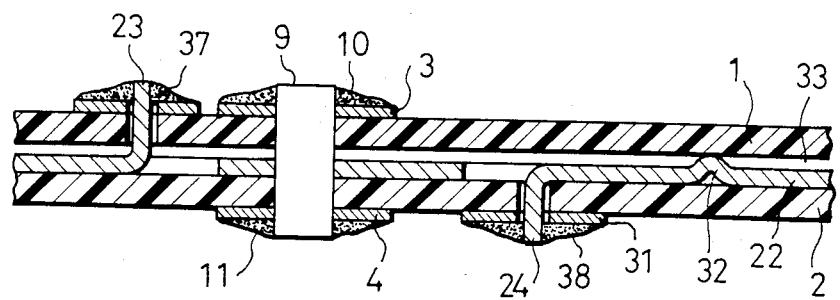
FIG. 4 is a cross section of another embodiment.
Figure 5:
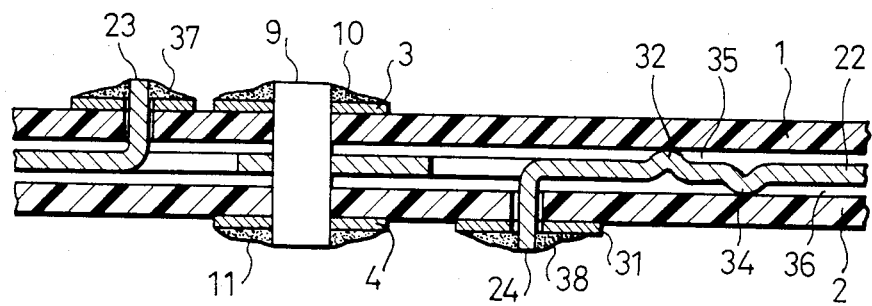
FIG. 5 is a cross section of still another embodiment.

FIGS. 4 and 5 show other embodiment of the present invention. FIG. 4 is a cross section of another embodiment wherein a projecting portion 32 is formed on one surface of the metal plate 22 thereby forming a space 33 between the first and second printed circuit boards 1 and 2.

FIG. 5 is a cross section of still another embodiment wherein two projecting portions 32 and 34 are provided on both surfaces of the metal plate 22 respectively thereby forming two spaces 35 and 36 between the metal plate 22 and the first and second printed circuit boards 1 and 2.

Figure 6:
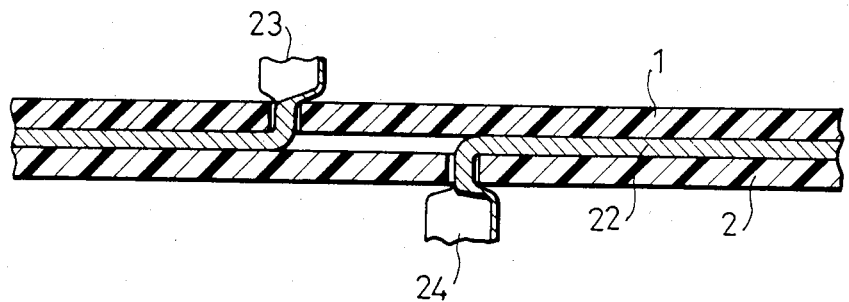
FIG. 6 is a cross section of still another embodiment.

In thus constructions shown in FIGS. 4 and 5, since the space 35 or spaces 35, 36 is formed between the first and second printed circuit boards 1 and 2, even if the first and second printed circuit boards 1 and expand or shrink due to changes in ambient conditions such as ambient temperature and humidity, etc., stresses caused by the expansion or shrinkage of the circuit boards can be absorbed by the provision of the space 33 or spaces 35, 36. Thus, the stresses thus caused can not be affected to other parts such as the electric part 9 and the solders, so that the part 9 is prevented from being broken and also the electrical connections between the solders and the electric parts are prevented from being disconnected. The stresses can be absorbed more efficiently if the projecting portions 32 and 34 are formed so as to be elastic. In the above described respective embodiments, if there is no neccessity of providing grounding constructions, the printing circuit boards 1 and 2 can be fixed to each other merely by twisting tip portions of the upright and dependent tabs 23 and 24 without soldering them as shown in FIG. 6. In this construction, the first printed circuit board 1 can be completely electrically shielded from the second printed circuit board 2.

As described above, according to the present invention, there is provided with an grounding construction of a multilayer printed circuit board, wherein a metal plate provided with at least one upright tab is inserted between opposing two printed circuit boards, at least one of the circuit boards is provided with a through hole corresponding to the upright tab for passing the upright tab therethrough, the upright tab is inserted into the through hole so that its tip portion protrudes from the outer surface on the printed circuit board, the tip portion of the upright tab is electrically connected to a conduction pattern formed on the outer surface of the printed circuit board around the through hole through a solder, and the metal plate is connected to a chassis. By this construction, the present invention has various advantages as described below. Namely, each of the printed circuit boards can be shielded by the metal plate from the other. Further, the grounding conduction patterns formed on the opposing two printed two circuit boards are not required to be disposed in an opposite relation, so that the degree of freedom in designing other circuit patterns can be improved. The number of electric parts can be decreased when compared with the conventional grounding construction because a pin passed through the printed circuit boards for connecting grounding conduction patterns formed on the boards is not required. The grounding conduction pattern is earthed through the metal plate with a large area, so that the grounding effect of the present invention is superior to the conventional grounding construction.

Further, according to one aspect of the present invention, at least one projecting portion is provided on one surface of the metal plate thereby forming at least one space between the opposing printed circuit boards, so that a stress caused by the expansion or shrinkage of the circuit boards due to changes in ambient temperature and humidity, etc. can be absorbed by the space thereby preventing the breakage of parts and the disconnections between the solders and the parts.

What is claimed is:

1. A grounding construction for multilayered printed circuit boards comprising:

a pair of printed circuit boards, each comprising a layer of insulative material and an electrical circuit pattern printed on one side thereof, said printed circuit boards being disposed in parallel with their sides of insulative material facing inwardly and their sides having printed circuit patterns thereon facing outwardly;

a metal grounding plate disposed in parallel between the insulative sides of said pair of printed circuit boards, said plate having at least a pair of tabs each formed by bending a cutout portion of said plate at an angle to the plane of said plate so as to extend in opposite side directions therefrom, said metal grounding plate being grounded to a chassis; and at least one hole formed through the insulative layer of each of said pair of printed circuit boards for receiving a respective one of said pair of tabs therethrough, each of said tabs having a tip portion extending to the other side of the respective printed circuit board whereby it can be connected to a portion of the printed circuit pattern of said board for purposes of providing a grounding connection, whereby the printed circuit pattern on each board can be grounded through the respective tab and to said common metal grounding plate independently of and electrically shielded from the printed circuit pattern of the other printed circuit board.

2. A grounding construction for a multilayer printed circuit board according to claim 1, wherein said metal plate is provided with at least one projection portion protruding toward one of said printed circuit boards thereby forming at least one space between said printed circuit boards.

3. A grounding construction for a multilayer printed circuit board according to claim 1, wherein said metal plate is provided with first and second protruding portions protruding toward one and the other of said printed circuit boards respectively thereby forming a first space between one of said printed circuit boards and a second space between the other of said printed circuit boards.

* * * * *